United States Patent
Wu et al.

(10) Patent No.: US 11,508,179 B2
(45) Date of Patent: Nov. 22, 2022

(54) ELECTRONIC DEVICE, FINGERPRINT IMAGE PROCESSING METHOD AND RELATED PRODUCTS

(71) Applicant: GUANGDONG OPPO MOBILE TELECOMMUNICATIONS CORP., LTD., Guangdong (CN)

(72) Inventors: Anping Wu, Guangdong (CN); Le Yang, Guangdong (CN); Xuejian Yuan, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 17/243,420

(22) Filed: Apr. 28, 2021

(65) Prior Publication Data
US 2021/0248344 A1    Aug. 12, 2021

Related U.S. Application Data

(63) Continuation of application No. PCT/CN2019/101607, filed on Aug. 20, 2019.

(30) Foreign Application Priority Data

Oct. 30, 2018   (CN) .......................... 201811280531.5
Oct. 30, 2018   (CN) .......................... 201821777834.3

(51) Int. Cl.
   *G06V 40/13*   (2022.01)
(52) U.S. Cl.
   CPC ................................. *G06V 40/1318* (2022.01)
(58) Field of Classification Search
   CPC ........................................... G06V 40/12–1394
   See application file for complete search history.

(56) References Cited

U.S. PATENT DOCUMENTS 7,239,227 B1 * 7/2007 Gupta .................. B60R 25/25
                                                    340/5.82
2017/0372113 A1 * 12/2017 Zhang ................ H01L 51/5253
(Continued)

FOREIGN PATENT DOCUMENTS

CN        106339682 A        1/2017
CN        107025451 A        8/2017
(Continued)

OTHER PUBLICATIONS

ISR with English translation for PCTCN2019101607 mailed Nov. 13, 2019.
(Continued)

*Primary Examiner* — Patrick F Marinelli
(74) *Attorney, Agent, or Firm* — Young Basile Hanlon & MacFarlane, P.C.

(57) ABSTRACT

Provided is an electronic device. The electronic device includes a screen provided with a first polarizer, a second polarizer arranged below the screen, and an optical fingerprint identification module arranged below the second polarizer. The polarization direction of the first polarizer is the same with the polarization direction of the second polarizer. The first polarizer and the second polarizer are configured to filter a first optical noise. The second polarizer is configured to filter a second optical noise. The first optical noise is light from screen light of the screen and directing to the optical fingerprint recognition module. The second optical noise is light from the screen light, directing away from the optical fingerprint recognition module and reflected by a glass cover on an outer side of the screen.

19 Claims, 5 Drawing Sheets

(56) References Cited

U.S. PATENT DOCUMENTS

| | | | | |
|---|---|---|---|---|
| 2018/0005007 A1* | 1/2018 | Du | ................. | H01L 27/3265 |
| 2018/0068166 A1* | 3/2018 | Zeng | ................. | A61B 5/1172 |
| 2018/0175125 A1* | 6/2018 | Chung | ............. | G06V 40/1318 |
| 2019/0157337 A1* | 5/2019 | Lin | ................. | H01L 27/14621 |
| 2019/0310724 A1* | 10/2019 | Yeke Yazdandoost | ................. | |
| | | | | H01L 51/5253 |
| 2020/0026898 A1* | 1/2020 | Fan | ................. | H04N 5/2254 |
| 2020/0074063 A1* | 3/2020 | Yoshimine | ............ | G06T 7/00 |
| 2020/0400986 A1* | 12/2020 | Yuan | ............... | G02F 1/13338 |
| 2020/0400987 A1* | 12/2020 | Yuan | ............... | H04M 1/0266 |
| 2020/0403024 A1* | 12/2020 | Lin | ................. | H01L 27/14678 |
| 2021/0248344 A1* | 8/2021 | Wu | ................. | G02F 1/133528 |
| 2021/0248345 A1* | 8/2021 | Wu | ................. | G06V 40/1318 |
| 2021/0248346 A1* | 8/2021 | Wu | ................. | G06V 40/1318 |

FOREIGN PATENT DOCUMENTS

| | | | |
|---|---|---|---|
| CN | 107065274 | A | 8/2017 |
| CN | 207637122 | U | 7/2018 |
| CN | 109241953 | A | 1/2019 |
| CN | 209055954 | U | 7/2019 |

OTHER PUBLICATIONS

Extended European Search Report for EP Application 19880635.8 dated Dec. 3, 2021. (9 pages).

* cited by examiner

ELECTRONIC DEVICE, FINGERPRINT IMAGE PROCESSING METHOD AND RELATED PRODUCTS

CROSS-REFERENCE TO RELATED APPLICATION(S)

This application is a continuation application of International Application No. PCT/CN2019/101607, filed on Aug. 20, 2019, which claims priority to Chinese Patent Application No. 201811280531.5, filed on Oct. 30, 2018, and Chinese Patent Application No. 201821777834.3, filed on Oct. 30, 2018, the entire contents of all of which are incorporated herein by reference.

TECHNICAL FIELD

The present disclosure generally relates to a field of electronic device technologies, and particularly to an electronic device, and a method for processing a fingerprint image and related products.

BACKGROUND

With the widespread application of electronic devices (such as mobile phones, tablet computers, etc.), the electronic devices can support more and more applications, with more and more powerful functions. The electronic devices are developing in a diversified and personalized direction and become indispensable to users' lives.

Fingerprint recognition technology has become a standard technology of electronic devices. With the development of fingerprint recognition technology, optical fingerprint identification module is popular currently.

SUMMARY

Embodiments of the present disclosure provide an electronic device. The electronic device includes a screen provided with a first polarizer, a second polarizer and an optical fingerprint identification module, the second polarizer being arranged below the screen, and the optical fingerprint identification module being arranged below the second polarizer. A polarization direction of the first polarizer is the same with the polarization direction of the second polarizer. The first polarizer and the second polarizer are both configured to filter a first optical noise from a screen light of the screen and directing to the optical fingerprint identification module. The second polarizer is configured to filter a second optical noise from screen light of the screen, directing away from the optical fingerprint identification module and reflected by a glass cover on an outer side of the screen.

Embodiments of the present disclosure provide a method for processing a fingerprint image. The method is applied to an electronic device. The electronic device includes a screen provided with a first polarizer, a second polarizer, and an optical fingerprint identification module. The second polarizer is arranged below the screen. The optical fingerprint identification module is arranged below the second polarizer. A polarization direction of the first polarizer is the same with the polarization direction of the second polarizer. The method includes: turning on the screen to emit light and activating the optical fingerprint identification module in response to a fingerprint collection instruction, in which a first optical noise from a screen light of the screen and directing to the optical fingerprint identification module is filtered by both the first polarizer and the second polarizer, a second optical noise from the screen light of the screen, directing away from the optical fingerprint identification module and reflected by a glass cover on an outer side of the screen is filtered by the second polarizer; and collecting a reflected light of the screen light reflected by a user fingerprint through the optical fingerprint identification module and acquiring a fingerprint image after processing the reflected light.

Embodiments of the present disclosure provide an electronic device. The electronic device includes a processor, a memory, a screen provided with a first polarizer, a second polarizer, and an optical fingerprint identification module. The second polarizer is arranged below the screen. The optical fingerprint identification module is arranged below the second polarizer. A polarization direction of the first polarizer is the same with the polarization direction of the second polarizer. The one or more programs are stored in the memory and configured to include instructions for executing a method for processing a fingerprint image. The method includes: turning on the screen to emit light and activating the optical fingerprint identification module in response to a fingerprint collection instruction, in which a first optical noise from a screen light of the screen and directing to the optical fingerprint identification module is filtered by both the first polarizer and the second polarizer, a second optical noise from the screen light of the screen, directing away from the optical fingerprint identification module and reflected by a glass cover on an outer side of the screen is filtered by the second polarizer; and collecting a reflected light of the screen light reflected by a user fingerprint through the optical fingerprint identification module and acquiring a fingerprint image after processing the reflected light.

BRIEF DESCRIPTION OF DRAWINGS

In order to clearly describe the technical solutions in the embodiments of the present disclosure or the related art, the following will briefly introduce the drawings that will be used in the description of the embodiments or the related art. It will be apparent that the drawings in the following description are only some embodiments of the present disclosure. For those skilled in the art, other drawings can be obtained based on these drawings without creative work.

DETAILED DESCRIPTION

Figure 1:
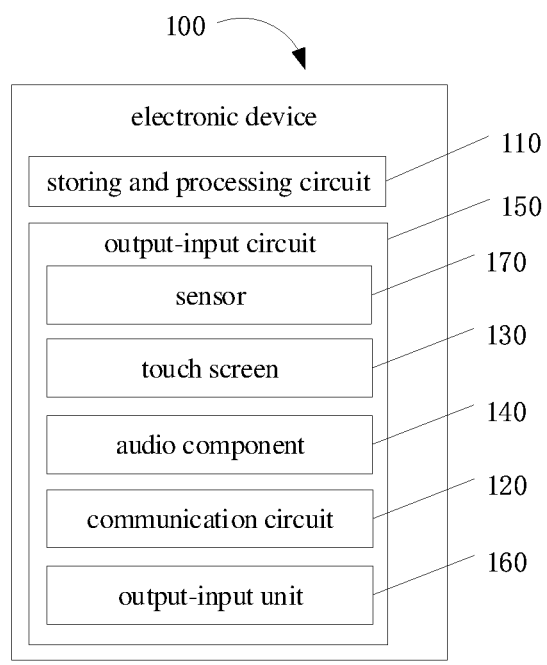
FIG. 1 is a schematic diagram illustrating an electronic device according to some embodiments of the present disclosure.

In order to enable those skilled in the art to well understand the solutions of the disclosure, the technical solutions in the embodiments of the present disclosure will be clearly and completely described below in combination with the drawings in the embodiments of the disclosure. It will be apparent that the described embodiments are only a part of the embodiments of the present disclosure, but not all embodiments. Based on the embodiments of the disclosure, all other embodiments obtained by those skilled in the art without creative work shall fall within the protection scope of this disclosure.

The terms "first", "second", etc. used in the specification, claims and the above drawings of the disclosure are used to distinguish different objects, rather than to describe a specific sequence. In addition, the terms "including/comprising", "having" and any variations are intended to cover non-exclusive inclusions. For example, processes, methods, systems, products, or devices that include a series of steps or units are not limited to listed steps or units, but optionally includes unlisted steps or units, or optionally also include other steps or units inherent to these processes, methods, products, or devices.

The term "embodiments" mentioned in this disclosure means that specific features, structures, or characteristics described in combination with the embodiments may be included in at least one embodiment of the present disclosure. This phrase presented in various places of the specification does not necessarily refer to the same embodiment, nor is it an independent or alternative embodiment mutually exclusive with other embodiments. Those skilled in the art may explicitly and implicitly understand that the embodiments described herein can be combined with other embodiments.

The electronic device involved in the embodiments of the present disclosure may include various handheld devices, on-board devices, wearable devices (such as smart watches, smart bracelets, wireless earphones, augmented reality/virtual reality devices, smart glasses), computing device with wireless communication functions, or other processing devices connected to a wireless modem, as well as various forms of user equipment (UE), mobile stations (MS), terminal devices, etc. For the sake of easy description, the above devices are collectively called the electronic device.

Fingerprint recognition technology has become a standard technology of electronic devices. With the development of fingerprint recognition technology, optical fingerprint identification module is popular currently. The optical fingerprint identification module can be well integrated below the screen. However, since the screen emits light, the light causes interference to imaging fingerprints by the optical fingerprint identification module to a certain extent, thus reducing the efficiency of fingerprint collection.

Embodiments of the present disclosure provide an electronic device, a method for processing a fingerprint image and related products, which may reduce the influence of screen light to imaging fingerprints and improve the efficiency of fingerprint collection.

In some examples, the electronic device includes the screen provided with the first polarizer, the second polarizer, and the optical fingerprint identification module. The second polarizer is arranged below the screen, and the optical fingerprint identification module is arranged below the second polarizer. The polarization direction of the first polarizer is the same with the polarization direction of the second polarizer. The first polarizer and the second polarizer are configured to filter the first optical noise from a screen light of the screen and directing to the optical fingerprint identification module, and the second polarizer is configured to filter the second optical noise from the screen light of the screen, directing away from the optical fingerprint identification module and reflected by the glass cover on an outer side of the screen. Therefore, by arranging a polarizer below the screen, and the polarization direction of the polarizer being the same as the polarization direction of the display layer, the first optical noise may be attenuated directly by half. The polarization direction of light of the second optical noise may change after passing through the screen medium and the light may be also attenuated after passing through the polarizer arranged below the screen. Due to the same direction of the two polarizers, the correct fingerprint image light will have no loss.

The following will describe the embodiments of the present disclosure in detail.

As illustrated in FIG. 1, FIG. 1 is a schematic diagram illustrating an electronic device according to some embodiments of the present disclosure. The electronic device 100 may include a storing and processing circuit 110 and a sensor 170 connected to the storing and processing circuit 110. The sensor 170 may include a camera.

The electronic device 100 may include a control circuit. The control circuit may include the storing and processing circuit 110. The storing and processing circuit 110 may include a memory, such as a hard disk drive memory, a non-volatile memory (such as flash memory or other electronic programmable read-only memory used to form a solid-state drive, etc.), volatile memory (such as static or dynamic random-access memory, etc.), which is not limited in embodiments of the present disclosure. A processing circuit of the storing and processing circuit 110 may be configured to control operations of the electronic device 100. The processing circuit can be implemented based on one or more microprocessors, microcontrollers, digital signal processors, baseband processors, power management units, audio codec chips, application-specific integrated circuits, display driver integrated circuits, etc.

The storing and processing circuit 110 can be configured to run software in the electronic device 100, such as an Internet browsing application, a Voice over Internet Protocol (VOIP) calling application, an email application, a media playback application, and an operating system function, etc. The above software can be used to perform some control operations, such as image capturing based on cameras, ambient light measurement based on ambient light sensors, proximity sensor measurement based on proximity sensors, and information display function based on status indicators such as light emitting diodes, touch event detection based on touch sensors, functions associated with displaying information on multiple (for example, layered) screens, operations associated with performing wireless communication functions, operations associated with collecting and generating audio signals, control operations associated with collecting and processing button press event data, and other functions of the electronic device 100, which are not limited in embodiment of the present disclosure.

The electronic device 100 may include an output-input circuit 150. The input-output circuit 150 can be configured to allow the electronic device 100 to realize data input and output, that is, allow the electronic device 100 to receive data from an external device and allow the electronic device 100 to output data from the electronic device 100 to an external device. The output-input circuit 150 may further include a sensor 170. The sensor 170 may include an ambient light sensor, a proximity sensor based on light and capacitance, an optical fingerprint identification module, a touch sensor (such as a light-based touch sensor and/or a capacitive touch sensor, the touch sensor may be a part of a touch screen or used independently as a touch sensor), an acceleration sensor, a camera, and other sensors, etc. The camera can be a front camera or a rear camera. The optical fingerprint identification module can be integrated below the screen and configured to collect fingerprint images.

The input-output circuit 150 may also include one or more screens, such as the screen 130. The screen 130 may include one or a combination of liquid crystal display screen, organic light-emitting diode display screen, electronic ink display screen, plasma display screen, and display screen using other display technologies. The screen 130 may include a touch sensor array (i.e., the screen 130 may be a touch display screen). The touch sensor can be a capacitive touch sensor formed by an array of transparent touch sensor electrodes (such as indium tin oxide (ITO) electrodes), or a touch sensor formed using other touch technologies, such as sonic touch, pressure-sensitive touch, resistance touch, optical touch, etc., which are not limited in the embodiments of the present disclosure.

The electronic device 100 may also include an audio component 140. The audio component 140 may be configured to provide audio input and output functions for the electronic device 100. The audio component 140 in the electronic device 100 may include a speaker, a microphone, a buzzer, a tone generator, and other components for generating and detecting sounds.

The communication circuit 120 may be configured to provide the electronic device 100 with an ability to communicate with external devices. The communication circuit 120 may include analog and digital input-output interface circuits, and wireless communication circuits based on radio-frequency signals and/or optical signals. The wireless communication circuit in the communication circuit 120 may include a radio-frequency transceiver circuit, a power amplifier circuit, a low noise amplifier, a switch, a filter, and an antenna. For example, the wireless communication circuit in the communication circuit 120 may include a circuit for supporting near field communication (NFC) by transmitting and receiving near field coupled electromagnetic signals. For example, the communication circuit 120 may include a near field communication antenna and a near field communication transceiver. The communication circuit 120 may also include a cellular phone transceiver and antenna, a wireless local area network transceiver circuit and antenna, etc.

The electronic device 100 may further include a battery, a power management circuit, and other input-output unit 160. The input-output unit 160 may include buttons, joysticks, click wheels, scroll wheels, touch pads, keypads, keyboards, cameras, light-emitting diodes, and other status indicators.

The user can input commands through the input-output circuit 150 to control the operations of the electronic device 100, and can use the output data of the input-output circuit 150 to realize reception of status information and other outputs from the electronic device 100.

Figure 2:
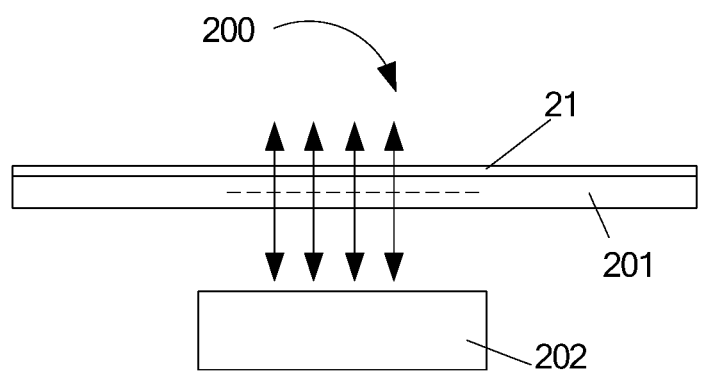
FIG. 2 is a schematic diagram illustrating another electronic device according to some embodiments of the present disclosure.

In the related art, as illustrated in FIG. 2, FIG. 2 is a schematic diagram illustrating an electronic device 200. The screen is represented by 201, the optical fingerprint identification module is represented by 202, and the glass cover on an outer side of the screen is represented by 21. The optical fingerprint identification module 202 can be well integrated below the screen 21. The operating principle is that, with self-emitting light of the screen, when a finger is placed on the screen, the self-emitting light is reflected when reaching the finger, and the optical fingerprint identification module receives the reflected light signal. Because of rugged ridges of the fingerprint, the light absorption degrees are different, thereby receiving a fingerprint image with bright and dark portions. However, the screen light on the one hand allows the optical fingerprint identification module to collect the fingerprint image, on the other hand creates some optical noises. In detail, the optical noises may include the first optical noise and the second optical noise. The first optical noise is light from the screen light of the screen and directing to the optical fingerprint identification module. The second optical noise is light from screen light of the screen, directing away from the optical fingerprint identification module and reflected by the glass cover on an outer side of the screen. Due to existences of the first optical noise and the second optical noise, the efficiency of capturing the fingerprint image is low.

Figure 3:
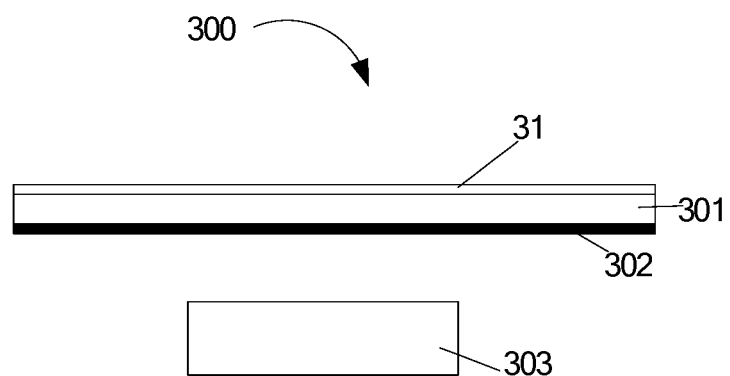
FIG. 3 is a schematic diagram illustrating another electronic device according to some embodiments of the present disclosure.

As illustrated in FIG. 3, FIG. 3 is a schematic diagram illustrating another electronic device according to some embodiments of the present disclosure. The electronic device 300 includes a screen 301 provided with a first polarizer, a second polarizer 302, and an optical fingerprint identification module 303. The second polarizer 302 is arranged below the screen 301. The optical fingerprint identification module 303 is arranged below the second polarizer 302. A polarization direction of the first polarizer is the same with the polarization direction of the second polarizer 303.

The first polarizer and the second polarizer 102 are configured to filter the first optical noise.

The second polarizer is configured to filter the second optical noise.

The first optical noise is light from screen light of the screen and directing to the optical fingerprint identification module. The second optical noise is light from screen light of the screen, directing away from the optical fingerprint identification module and reflected by the glass cover 31 on an outer side of the screen.

In some embodiments of the present disclosure, the polarizer is also called optical polarizer, which can control the polarization direction of light. After natural light passes through the polarizer, light whose vibration direction is perpendicular to a transmission axis of the polarizer will be absorbed, and polarized light whose vibration direction is parallel to the transmission axis of the polarizer will be left as passing light. Generally, a polarizer layer may be also arranged in stacked layers of the screen of the electronic device, i.e., the first polarizer arranged above a display layer and configured to reduce the reflection of external light and avoid white screen. Certainly, the light of the optical fingerprint will be attenuated after passing through the polarizer.

In a possible example, the second polarizer 302 and the screen 301 may be integrated or stacked.

In an example, a size of the second polarizer may be the same as a size of the screen. In another example, the size of the second polarizer may be smaller than that of the first polarizer, but completely cover the optical fingerprint identification module.

Figure 4:
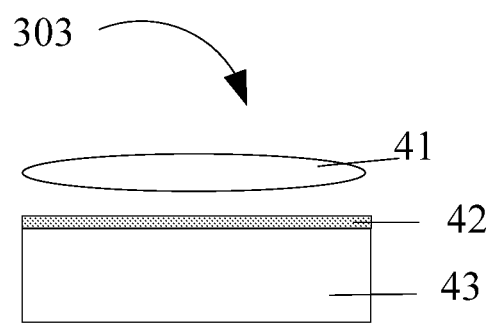
FIG. 4 is a schematic diagram illustrating an optical fingerprint identification module according to some embodiments of the present disclosure.

In a possible example, as illustrated in FIG. 4, FIG. 4 is a schematic diagram illustrating an optical fingerprint identification module 303 illustrated in FIG. 3. The optical fingerprint identification module 303 may include a collimating lens 41, an infrared (IR) film 42, an optical fingerprint sensor 43. The second polarizer 302 is arranged above the collimating lens 41. The IR 42 film is arranged on the surface of the optical fingerprint sensor 43.

The IR film is configured to filter infrared light. The collimating lens may be configured to convert light of each point passing through an aperture stop into parallel and collimating beams. The optical fingerprint sensor may be configured to realize fingerprint imaging.

Figure 5:
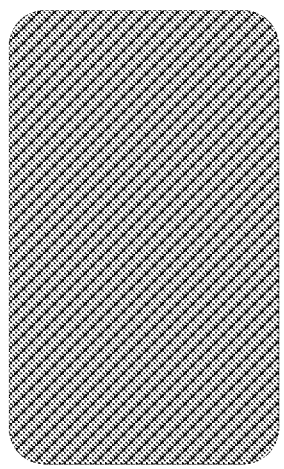
FIG. 5 is a demonstration diagram of a polarizer according to some embodiments of the present disclosure.

In detail, as illustrated in FIG. 5, FIG. 5 is a demonstration diagram of a polarizer. In the electronic device illustrated in FIG. 3, the first polarizer may be configured to absorb light in certain vibration directions from the first optical noise and the second optical noise, such that the first optical noise and the second optical noise are attenuated. At the same time, since the polarization direction of the second polarizer is the same as the polarization direction of the first polarizer, the second polarizer may not attenuate the light emitted by the fingerprint, thereby finally achieving noise reduction as well as improving the accuracy of capturing the fingerprint image.

In a possible example, the second polarizer 302 and the optical fingerprint identification module 303 may be integrated or stacked.

In a possible example, the second polarizer 302 and the collimating lens 41 may be integrated or stacked.

The term "integrated" mentioned above refers to embedding the second polarizer into the collimating lens to form a collimating lens with polarization function. The term "stacked" mentioned above refers to stacking a layer of polarizer on a side of the collimating lens that is closer to the optical fingerprint sensor than another side.

Figure 6:
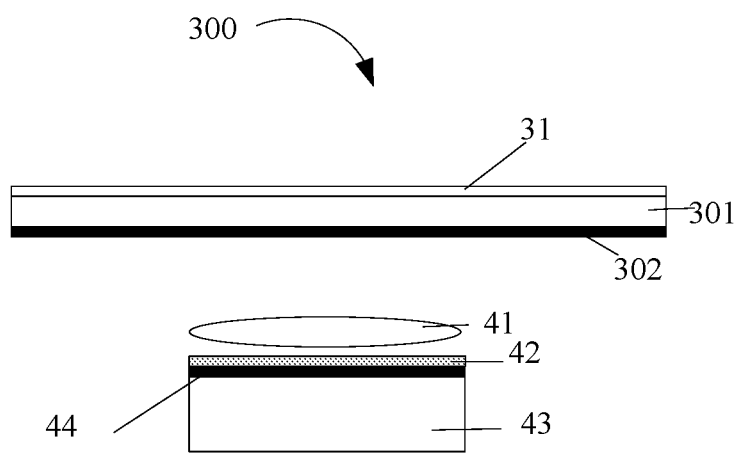
FIG. 6 is a flowchart illustrating another electronic device according to some embodiments of the present disclosure.

In a possible example, as illustrated in FIG. 6, FIG. 6 illustrates another variant structure of the electronic device of FIG. 3. The improvement is that a third polarizer 44 is provided to the optical fingerprint identification module. The fingerprint recognition module 303 includes a collimating lens 41, a third polarizer 44, an infrared (IR) film 42, and an optical fingerprint sensor 43. The third polarizer 44 is provided between the IR film 42 and the optical fingerprint sensor 43. The IR film 42 is arranged on the surface of the optical fingerprint sensor 43.

In detail, in the electronic device illustrated in FIG. 6, the first polarizer, the second polarizer, and the third polarizer can be configured to absorb light in certain vibration directions from the first optical noise and the second optical noise, such that the first optical noise and second optical noise may be attenuated. At the same time, since the polarization direction of the second polarizer and the polarization direction of the third polarizer are the same with the polarization direction of the first polarizer, the second polarizer will not attenuate the light emitted by the fingerprint, thereby finally achieving noise reduction as well as improving the accuracy of capturing the fingerprint image.

In a possible example, the IR film 42 and the third polarizer 44 may be integrated or stacked.

Figure 7:
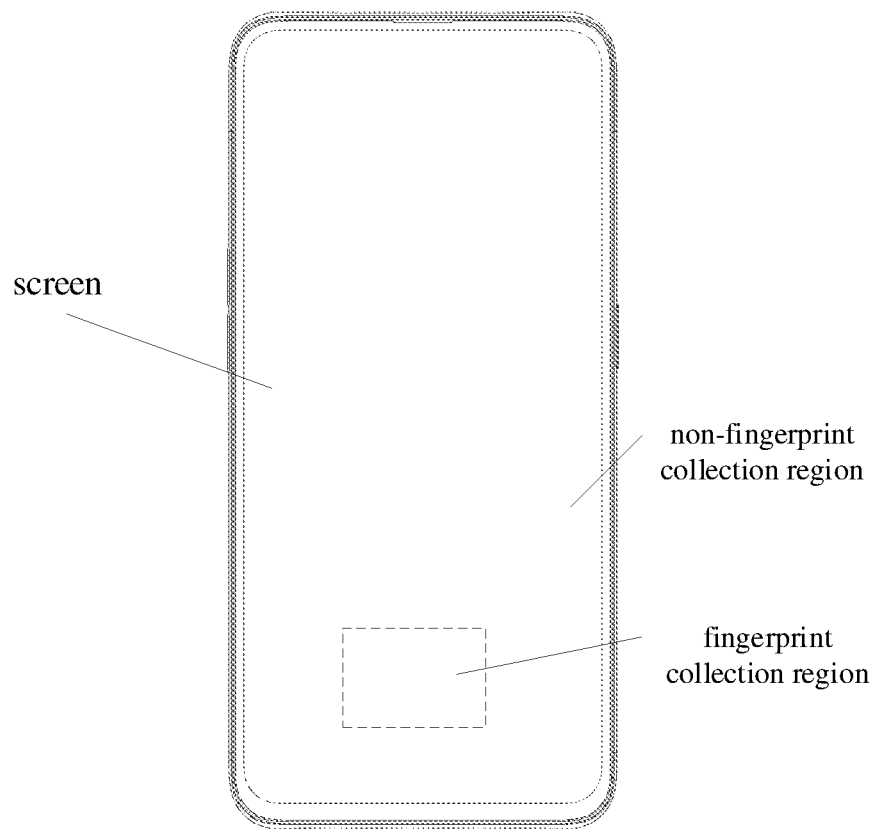
FIG. 7 is a demonstration diagram of a fingerprint collection region of an electronic device according to some embodiments of the present disclosure.

In a possible example, as illustrated in FIG. 7, the optical fingerprint identification module 303 is arranged in a preset region at a lower portion of the electronic device. That is, only a part of the region below the screen may be used for the fingerprint collection. This preset region may also be referred to as a fingerprint collection region.

In a possible example, the screen includes a liquid crystal display (LCD) screen or an organic light-emitting diode (OLED) display screen.

In a possible example, the first optical noise and/or the second optical noise are light emitted from the preset region.

It can be seen, the electronic device according to embodiments of the present disclosure includes the screen provided with the first polarizer, the second polarizer, and the optical fingerprint identification module. The second polarizer is arranged below the screen. The optical fingerprint identification module is arranged below the second polarizer. The polarization direction of the first polarizer is the same with the polarization direction of the second polarizer. The first polarizer and the second polarizer are configured to filter the first optical noise. The second polarizer is configured to filter the second optical noise. The first optical noise is light from the screen light of the screen and directing to the optical fingerprint identification module. The second optical noise is light from the screen light of the screen, directing away from the optical fingerprint identification module and reflected by the glass cover on an outer side of the screen. Therefore, by providing the polarizer below the screen and the polarization direction of the polarizer being the same as the polarization direction over the display layer, the first optical noise may be attenuated by half. The polarization direction of light of the second optical noise will change after passing through the screen medium and the light will be also attenuated after passing through the polarizer arranged below the screen. Due to the same directions of the two polarizers, the correct fingerprint image light will have no loss.

Figure 8:
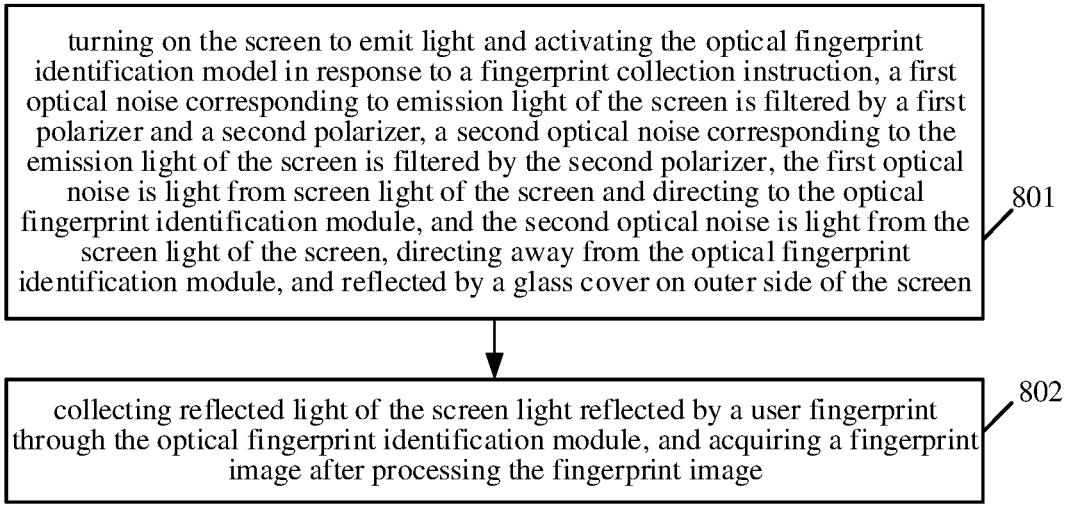
FIG. 8 is a flowchart illustrating a method for processing a fingerprint image according to some embodiments of the present disclosure.

As illustrated in FIG. 8. FIG. 8 is a flowchart illustrating a method for processing a fingerprint image according to some embodiments of the present disclosure. As illustrated in the FIG. 8, the method is applied to an electronic device as illustrated in FIG. 1. The electronic device includes a screen provided with a first polarizer, a second polarizer and an optical fingerprint identification module. The second polarizer is arranged below the screen. The optical fingerprint identification module is arranged below the second polarizer. A polarization direction of the first polarizer is the same with the polarization direction of the second polarizer. The method may include the following.

At 801, the screen is turned on to emit light and the optical fingerprint identification module is activated in response to a fingerprint collection instruction. A first optical noise corresponding to emission light of the screen is filtered by the first polarizer and the second polarizer, and a second optical noise corresponding to the emission light of the screen is filtered by the second polarizer. The first optical noise is light from screen light of the screen and directing to the optical fingerprint identification module. The second optical noise is light from screen light of the screen, directing away from the optical fingerprint identification module and reflected by a glass cover on an outer side of the screen.

The fingerprint collection instruction may be generated when the user presses the optical fingerprint identification module.

At 802, reflected light of the screen light reflected by a user fingerprint is collected through the optical fingerprint identification module and a fingerprint image is acquired after processing the reflected light.

The optical fingerprint identification module may be controlled to collect the reflected light of the user fingerprint, and the fingerprint image may be obtained after processing the reflected light.

In a possible example, turning on the screen to emit light in 801 may include the following.

A preset region of the screen is turned on to emit light. The preset region is a fingerprint collection region.

The above-mentioned preset region is a region corresponding to the optical fingerprint identification module arranged below the screen. In detail, the above can be understood with reference to FIG. 7.

In a possible example, after 802, the method may include the following.

In A1, the fingerprint image is compared with a preset fingerprint template.

In A2, an unlocking operation is performed when the fingerprint image successfully matches the preset fingerprint template. The preset fingerprint template may be stored in the electronic device in advance. When the fingerprint image matches the preset fingerprint template successfully, the unlocking operation can be performed. Otherwise, the user is prompted that the unlocking is unsuccessful with the fingerprint or the user is prompted to re-enter fingerprints. The unlocking operation may be at least one of: entering a home page from a locked screen or a black screen, launching a preset application from a locked screen or a black screen, or performing a preset operation. The preset operations may be at least one of: deletion operation, modification operation, compression operation, selection operation, photographing operation, payment operation, etc., which are not limited here.

In a possible example, comparing the fingerprint image with the preset fingerprint template in A1 may include the following.

In A21, image segmentation is performed on the fingerprint image to obtain a target fingerprint region image.

In A22, a distribution of feature points contained in the target fingerprint region image is analyzed.

In A23, M circular fingerprint region images are obtained by performing circular image interception on the target fingerprint region image based on M circles having different circular centers, where M is an integer greater than 3.

In A24, a target circular fingerprint region image is selected from the M circular fingerprint region images. The number of feature points contained in the target circular fingerprint region image is greater than the number of feature points contained in remaining circular fingerprint region images of the M circular fingerprint region images.

In A25, a circle and N circular rings are obtained by dividing the target circular fingerprint region image. Radius of the circle and ring widths of the N circular rings are the same.

In A26, feature points contained in the circle each circular ring are compared with feature points contained in the preset fingerprint template, starting from the circle having the smallest radius, and matching values corresponding to compared circle and circular rings are summed up.

In A27, comparing the feature points is stopped when the summed-up matching value is greater than a target fingerprint identification threshold and a prompt message indicating that the fingerprint identification is successful is output.

The electronic device may perform segment the fingerprint image to obtain the target fingerprint region image, analyze the distribution of the feature points contained in the target fingerprint region image, and perform circular image interception on the target fingerprint region image based on M circles having different circular centers to obtain M circular fingerprint region images, where M is an integer greater than 3, select the target circular fingerprint region image from the M circular fingerprint region images, where the number of feature points contained in the target circular fingerprint region image is greater than the number of feature points contained in the remaining circular fingerprint region images of the M circular fingerprint region images, divide the target circular fingerprint region image to obtain a circle and N circular rings, where the radius of the circle and the ring widths of the N circular rings are the same, compares the feature points contained in the circle and each circular ring with the feature points contained in the preset fingerprint template starting from the circle having a minimum radius, and sum up matching values corresponding to compared circle and circular rings. In this way, in the fingerprint identification process, the feature points of different positions or different fingerprints may be compared, i.e., the entire fingerprint image is sampled and this sample may cover the entire fingerprint region. Thus, corresponding representative features can be found in each region for comparison. When the summed-up matching value is greater than the target fingerprint recognition threshold, the feature point comparison is stopped immediately, and a prompt message indicating a successful fingerprint identification will be output. Therefore, the fingerprint can be quickly and accurately recognized.

It can be seen, the method for processing a fingerprint image according to embodiments of the present disclosure is applied to an electronic device. The electronic device includes the screen provided with the first polarizer, the second polarizer, and the optical fingerprint identification module. The second polarizer is arranged below the screen. The optical fingerprint identification module is arranged below the second polarizer. The polarization direction of the first polarizer is the same as the polarization direction of the second polarizer. In the fingerprint collection process, the first polarizer and the second polarizer are configured to filter the first optical noise, and the second polarizer is configured to filter the second optical noise. The first optical noise is light from the screen light of the screen and directing to the optical fingerprint identification module. The second optical noise is light from the screen light of the screen, directing away from the optical fingerprint identification module and reflected by the glass cover on an outer side of the screen. Therefore, by providing the polarizer below the screen, the polarization direction of the polarizer is the same as the polarization direction over the display layer, the first optical noise may be attenuated by half. The polarization direction of light of the second optical noise will change after passing through the screen medium and the light will be also attenuated after passing through the polarizer arranged below the screen. Due to the same directions of the two polarizers, the correct fingerprint image light will have no loss, thereby improving the efficiency of fingerprint collection.

Figure 9:
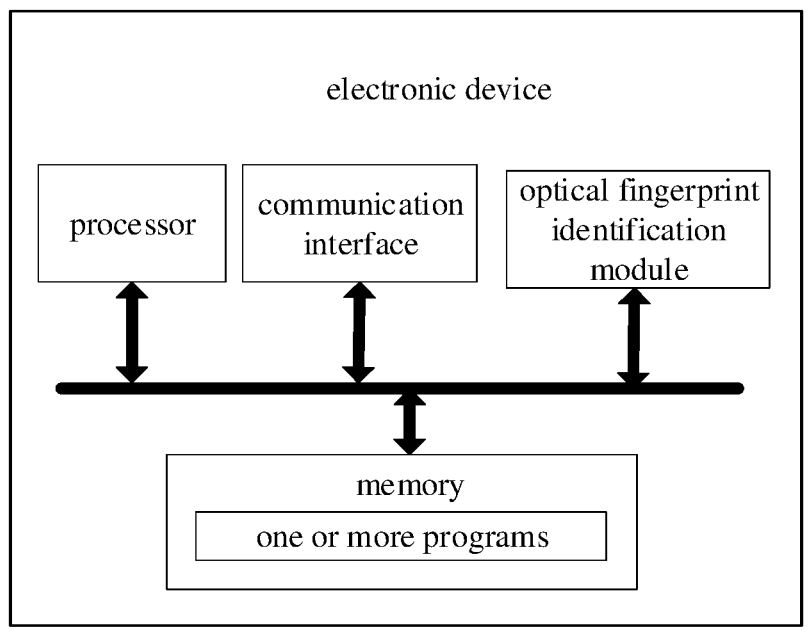
FIG. 9 is a schematic diagram illustrating another electronic device according to some embodiments of the present disclosure.

Consistent with the foregoing embodiments. As illustrated in FIG. 9, FIG. 9 is a schematic diagram illustrating an electronic device according to some embodiments of the present disclosure. As illustrated in FIG. 9, the electronic device may include a processor, a memory, a communication interface, and one or more programs. The electronic device may include an optical fingerprint identification module, and include a screen provided with a first polarizer and a second polarizer. The second polarizer is arranged below the screen. The optical fingerprint identification module is arranged below the second polarizer. A polarization direction of the first polarizer is the same with a polarization direction of the second polarizer. The one or more programs are stored in the memory and configured to be executed by the above processor. In some embodiments of the present disclosure, the above programs may include instructions for executing the following.

The screen is turned on to emit light and the optical fingerprint identification module is activated in response to a fingerprint collection instruction. A first optical noise corresponding to emission light of the screen is filtered by the first polarizer and the second polarizer. A second optical noise corresponding to the emission light of the screen is filtered by the second polarizer. The first optical noise is light from screen light of the screen and directing to the optical fingerprint identification module. The second optical noise is light from the screen light from the screen, directing away from the optical fingerprint identification module and reflected by a glass cover on an outer side of the screen.

Reflected light of the screen light reflected by a user fingerprint is collected through the optical fingerprint identification module and a fingerprint image is acquired after processing the reflected light.

It can be seen, the electronic device according to the embodiments of the present disclosure may include the screen provided with the first polarizer, the second polarizer, and the optical fingerprint identification module. The second polarizer is arranged below the screen. The optical fingerprint identification module is arranged below the second polarizer. The polarization direction of the first polarizer is the same with the polarization direction of the second polarizer. The first polarizer and the second polarizer are configured to filter the first optical noise. The second polarizer is configured to filter the second optical noise. The first optical noise is light from the screen light of the screen directing to the optical fingerprint identification module. The second optical noise is light from the screen light of the screen, directing away from the optical fingerprint identification module and reflected by the glass cover on an outer side of the screen. Therefore, by providing a polarizer below the screen, the polarization direction of the polarizer is the same as the polarization direction over the display layer, the first optical noise may be attenuated by half. The polarization direction of light of the second optical noise will change after passing through the screen medium and the light will be also attenuated after passing through the polarizer arranged below the screen. Due to the same directions of the two polarizers, the correct fingerprint image light will have no loss.

In a possible example, in terms of turning on the screen to emit light, the above programs may include instructions for executing the following.

A preset region of the screen is turned on to emit light. The preset area is a fingerprint collection region.

In a possible example, the above programs may further include instructions for executing the following:

The fingerprint image is compared with a preset fingerprint template.

An unlocking operation is performed when the fingerprint image successfully matches the preset fingerprint template.

In a possible example, in terms of comparing the fingerprint image with the preset fingerprint template, the above programs may include instructions for executing the following.

Image segmentation is performed on the fingerprint image to obtain a target fingerprint region image.

A distribution of feature points contained in the target fingerprint region image is analyzed.

Circular image interception is performed on the target fingerprint region image based on M circles having different circular centers to obtain M circular fingerprint region images, where M is an integer greater than 3.

A target circular fingerprint region image is selected from the M circular fingerprint region images. The number of feature points contained in the target circular fingerprint region image is greater than the number of feature points contained in remaining circular fingerprint region images of the M circular fingerprint region images.

The target circular fingerprint region image is divided to obtain a circle and N circular rings. Radius of the circle and ring widths of the N circular rings are the same.

Starting from a circle having a minimum radius, feature points contained in the circle and each circular ring are compared with feature points contained in the preset fingerprint template, and matching values of compared circle and circular rings are summed up.

Comparing the feature points is stopped when the summed-up matching value is greater than a target fingerprint recognition threshold and a prompt message indicating that the fingerprint recognition is successful is output.

The above mainly describes the solution of the embodiments of the present disclosure from the perspective of the execution process on the method side. It can be understood, the electronic device may include hardware structures and/or software modules corresponding to execute various functions for realizing the above functions. Those skilled in the art should may easily realize that, in combination with units and algorithm steps of examples described in the embodiments of the present disclosure, the disclosure may be realized by hardware or the combination of hardware and computer software. Whether some functions are executed in a manner of hardware or a manner of computer software driving hardware may be determined by specific application and design constraints of the technical solution. Those skilled in the art may use different methods for each specific application to realize the described functions, but such realization should not be considered as going beyond the scope of the present disclosure.

The embodiments of the present disclosure may divide electronic device into functional units according to the above method embodiments. For example, the electronic device may be divided into functional unit each corresponding to a function, or two or more functions may be integrated into one processing unit. The above integrated unit can be implemented in the form of hardware or the form of software functional unit. It should be noted, the division of units in the embodiments of the present disclosure is illustrative, and is only a logical function division, and there may be other division methods in actual implementation.

Figure 10A:
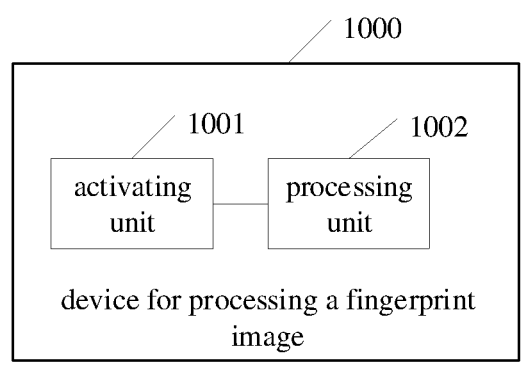
FIG. 10A is a block diagram illustrating constituent function units of a device for processing a fingerprint image according to some embodiments of the present disclosure.

FIG. 10A is a block diagram illustrating constituent functional units of a device 100 for processing a fingerprint image according to some embodiments of the present disclosure. The device 1000 for processing a fingerprint image may be applied to an electronic device. The electronic device may include a screen provided with a first polarizer, a second polarizer, and an optical fingerprint identification module. The second polarizer is arranged below the screen. The optical fingerprint identification module is arranged below the second polarizer. A polarization direction of the first polarizer is the same with the polarization direction of the second polarizer. The device 1000 may include an activating unit 1001 and a processing unit 1002.

The activating unit 1001 is configured to turn on the screen to emit light and activate the optical fingerprint identification module in response to a fingerprint collection instruction. A first optical noise corresponding to emission light of the screen is filtered by the first polarizer and the second polarizer. A second optical noise corresponding to the emission light of the screen is filtered by the second polarizer. The first optical noise is light from screen light of the screen and directing to the optical fingerprint identification module. The second optical noise is light from the screen light of the screen, directing away from the optical fingerprint identification module and reflected by a glass cover on an outer side of the screen.

The processing unit 1002 is configured to collect reflected light of the screen light reflected by a user fingerprint through the optical fingerprint identification module and obtain a fingerprint image after processing the reflected light.

It can be seen, the device for processing a fingerprint image according to some embodiments of the present disclosure is applied to the electronic device. The electronic device includes the screen provided with the first polarizer, the second polarizer, and the optical fingerprint identification module. The second polarizer is arranged below the screen. The optical fingerprint identification module is arranged below the second polarizer. The polarization directions of the first polarizer and the second polarizer are the same. The first polarizer and the second polarizer are configured to filter the first optical noise, and the second polarizer is configured to filter the second optical noise. The first optical noise is light from the screen light of the screen and directing to the optical fingerprint identification module. The second optical noise is light from the screen light of the screen, directing away from the optical fingerprint identification module and reflected by the glass cover on an outer side of the screen. Therefore, by providing a polarizer below the screen, the polarization direction of the polarizer is the same as the polarization direction over the display layer, the first optical noise may be attenuated by half. The polarization direction of light of the second optical noise will change after passing through the screen medium and the light will also be attenuated after passing through the polarizer arranged below the screen. Due to the same directions of the two polarizers, the correct fingerprint image light will have no loss.

In a possible example, in terms of turning on the screen to emit light, the activating unit 1001 may be further configured to execute the following.

A preset region of the screen is turned on to emit light. The preset region is a fingerprint collection region.

Figure 10B:
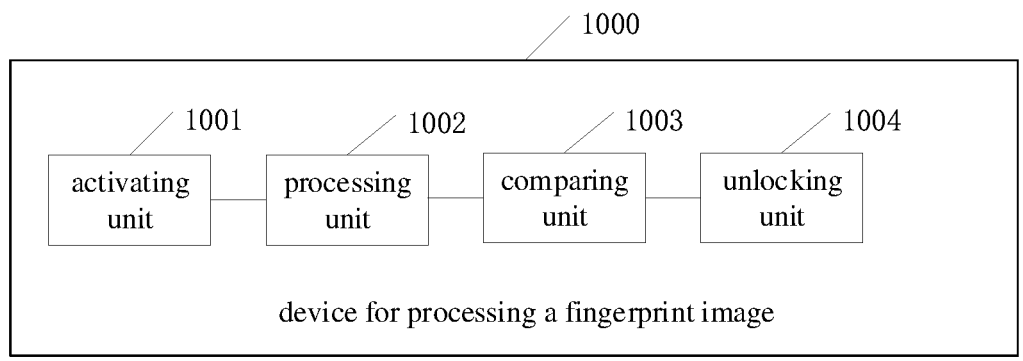
FIG. 10B is a block diagram illustrating constituent function units of another device for processing a fingerprint image according to some embodiments of the present disclosure.

In a possible example, as illustrated in FIG. 10B, FIG. 10B is a schematic diagram illustrating another modified structure of a device for processing a fingerprint image of FIG. 10A. Compared with FIG. 10A, the device may further include a comparing unit 1003 and an unlocking unit 1004.

The comparing unit 1003 is configured to compare the fingerprint image with a preset fingerprint template.

The unlocking unit 1004 is configured to perform an unlocking operation when the fingerprint image successfully matches the preset fingerprint template.

In a possible example, in terms of comparing the fingerprint image with the preset fingerprint template, the above comparing unit 1003 may be further configured to execute the following.

Image segmentation is performed on the fingerprint image to obtain a target fingerprint region image.

A distribution of feature points contained in the target fingerprint region image is analyzed.

Circular image interception is performed on the target fingerprint region image based on M circles having different circular centers to obtain M circular fingerprint region images, where M is an integer greater than 3.

A target circular fingerprint region image is selected from the M circular fingerprint region images. The number of feature points contained in the target circular fingerprint region image is greater than the number of feature points contained in remaining circular fingerprint region images of the M circular fingerprint region images.

The target circular fingerprint region image is divided to obtain a circle and N circular rings. Radius of the circle and ring widths of the N circular rings are the same.

Starting from a circle with a minimum radius, feature points contained in the circle and each circular ring are compared with feature points contained in the preset fingerprint template, and matching values corresponding to compared circle and circular rings are summed up.

Comparing the feature points is stopped and a prompt message indicating that the fingerprint recognition is successful is output when the summed-up matching value is greater than a target fingerprint recognition threshold.

Embodiments of the present disclosure also provide a computer-readable storage medium having computer programs for electronic data interchange stored thereon. The computer programs are configured to cause a computer to execute part or all the blocks of any method described in the method embodiments. The above computer may include an electronic device.

Embodiments of the present disclosure further provide a computer program product. The computer program product includes a non-transitory computer-readable storage medium having computer programs stored thereon. The computer programs are operable to cause a computer to execute part or all the blocks of any method described in the method embodiments. The computer program product may be a software package, and the above computer may include an electronic device.

It should be noted, for the above method embodiments, for the sake of simple description, they are all expressed as a series of action combinations, but those skilled in the art should know that this disclosure is not limited by the described sequence of actions. Because according to this disclosure, some blocks can be performed in other order or at the same time. Furthermore, those skilled in the art should also know that the embodiments described in the description are all preferable embodiments, and the actions and modules involved are not necessarily required by the disclosure.

In the above embodiments, the description of each embodiment has its own emphasis. For parts that are not described in detail in an embodiment, reference may be made to related descriptions of other embodiments.

In several embodiments according to the disclosure, it should be understood, the disclosed device may be implemented in other ways. For example, the device embodiments described above are only illustrative. For example, the division of the above units is only a logical function division, and there may be other divisions in actual implementation. For example, multiple units or components can be combined or integrated to another system, or some features can be ignored, or not implemented. In addition, the displayed or discussed mutual coupling or direct coupling or communication connection may be indirect coupling or communication connection through some interfaces, devices, or units, and may be in electrical or other forms.

The above units illustrated as separate parts may or may not be physically separated. The components displayed as units may or may not be physical units, i.e., they may be in one place, or may be distributed to multiple network units.

Some or all the units may be selected according to actual needs to achieve the purpose of solutions of the embodiment.

In addition, the functional units in various embodiments of the present disclosure may be integrated into one processing unit, or each unit may exist alone physically, or two or more units may be integrated into one unit. The above integrated unit can be implemented in the form of hardware or software functional units.

If the above integrated unit is implemented in the form of a functional unit of software and sold or used as an independent product, it can be stored in a computer-readable memory. Based on this understanding, the technical solution of the present disclosure essentially or the part that contributes to the existing technology or all or part of the technical solution can be embodied in the form of a software product. The computer software product is stored in a memory, including numerous instructions to enable a computer device (which may be a personal computer, a server, or a network device, etc.) to execute all or part of the blocks of the above methods of various embodiments of the present disclosure. The above memory includes: a U disk, a read-only memory (ROM), a random-access memory (RAM), a mobile hard disk, a magnetic disk, or an optical disk and other media that can store program codes.

Those skill in the art can understand that all or part of the blocks in various methods of the above embodiments can be completed by a program instructing relevant hardware. The program may be stored in a computer-readable memory, and the memory may include: a flash disk, a read-only memory (ROM), a random-access memory (RAM), a magnetic disk or an optical disc, etc.

Embodiments of the disclosure are described in detail above, and specific examples are used in the disclosure to illustrate the principles and implementation of the disclosure. The descriptions of the above embodiments are only used to help understand the methods and core ideas of the disclosure. Those skill in the art, based on the ideas of the present disclosure, will make changes in the specific implementation and the scope of application. In conclusion, the content of this specification should not be understood as a limit of the disclosure.

What is claimed is:

1. An electronic device, comprising: a screen provided with a first polarizer, a second polarizer arranged below the screen, and an optical fingerprint identification module arranged below the second polarizer,
    wherein a polarization direction of the first polarizer is the same with the polarization direction of the second polarizer;
    wherein the first polarizer and the second polarizer are configured to filter a first optical noise from a screen light of the screen and directing the first optical noise to the optical fingerprint identification module;
    wherein the second polarizer is configured to filter a second optical noise from the screen light of the screen and reflected by a glass cover on an outer side of the screen, and directing the second optical noise away from the optical fingerprint identification module;
    wherein the optical fingerprint identification module comprises a collimating lens, a third polarizer, an infrared IR film, and an optical fingerprint sensor, the third polarizer being arranged between the infrared IR film and the optical fingerprint sensor, the infrared IR film being arranged on surface of the optical fingerprint sensor, and a polarization direction of the third polarizer being the same with the polarization direction of the second polarizer.

2. The electronic device of claim 1, wherein the second polarizer and the screen are integrated or stacked.

3. The electronic device of claim 1, wherein the second polarizer being arranged above the collimating lens.

4. The electronic device of claim 3, wherein the second polarizer and the optical fingerprint identification module are integrated or stacked.

5. The electronic device of claim 4, wherein the second polarizer and the collimating lens are integrated or stacked.

6. The electronic device of claim 1, wherein the optical fingerprint identification module is located in a preset region at a lower portion of the electronic device.

7. The electronic device of claim 6, wherein at least one of the first optical noise or the second optical noise is a light emitted by the preset region.

8. The electronic device of claim 1, wherein the infrared IR film and the third polarizer are integrated or stacked.

9. The electronic device of claim 1, wherein the screen comprises a liquid crystal display LCD screen or an organic light-emitting diode OLED display screen.

10. A method for processing a fingerprint image, applied to an electronic device, the electronic device comprising a screen provided with a first polarizer, a second polarizer arranged below the screen, and an optical fingerprint identification module arranged below the second polarizer, a polarization direction of the first polarizer being the same with the polarization direction of the second polarizer; the method comprises:
    turning on the screen to emit light and activating the optical fingerprint identification module in response to a fingerprint collection instruction, wherein a first optical noise from a screen light of the screen and directing the first optical noise to the optical fingerprint identification module is filtered by the first polarizer and the second polarizer, and a second optical noise being a light from the screen light of the screen and reflected by a glass cover on an outer side of the screen that is filtered by the second polarizer, and directing the second optical noise away from the optical fingerprint identification module; and
    collecting a reflected light of the screen light reflected by a user fingerprint through the optical fingerprint identification module and obtaining a fingerprint image after processing the reflected light,
    wherein the optical fingerprint identification module comprises a collimating lens, a third polarizer, an infrared IR film, and an optical fingerprint sensor, the third polarizer being arranged between the infrared IR film and the optical fingerprint sensor, the infrared IR film being arranged on surface of the optical fingerprint sensor, and a polarization direction of the third polarizer being the same with the polarization direction of the second polarizer.

11. The method of claim 10, wherein turning on the screen to emit light comprises:
    turning on a preset region of the screen to emit light, the preset region being a fingerprint collection region.

12. The method of claim 10, further comprising:
    comparing the fingerprint image with a preset fingerprint template; and
    performing an unlocking operation based on the fingerprint image successfully matching the preset fingerprint template.

13. The method of claim 12, wherein the comparing the fingerprint image with the preset fingerprint template comprises:

performing image segmentation on the fingerprint image to obtain a target fingerprint region image;

performing circular image interception on the target fingerprint region image based on M circles having different circular centers to obtain M circular fingerprint region images, where M is an integer greater than 3;

selecting a target circular fingerprint region image from the M circular fingerprint region images, wherein the number of feature points included in the target circular fingerprint region image is greater than the number of feature points included in each of remaining circular fingerprint region images of the M circular fingerprint region images;

dividing the target circular fingerprint region image to obtain a circle and N circular rings, radius of the circle and ring widths of the N circular rings being the same;

starting from a circle with a minimum radius, comparing the feature points contained in the circle and each circular ring with the feature points contained in the preset fingerprint template, and summing up matching values corresponding to compared circle and circular rings to obtain a summed-up matching value; and stopping comparing the feature points based on the summed-up matching value being greater than a target fingerprint recognition threshold and outputting a prompt message indicating that fingerprint recognition is successful.

14. An electronic device, comprising: a processor, a memory, a screen provided with a first polarizer, a second polarizer arranged below the screen, and an optical fingerprint identification model arranged below the second polarizer, a polarization direction of the first polarizer being the same with the polarization direction of the second polarizer, wherein the memory is configured to store one or more programs executable by the processor, and the one or more programs comprise instructions for executing a method for processing a fingerprint image, the method comprising:

turning on a screen to emit light and activating the optical fingerprint identification module in response to a fingerprint collection instruction, wherein a first optical noise from a screen light of the screen and directing the first optical noise to the optical fingerprint identification module is filtered by the first polarizer and the second polarizer, and a second optical noise from the screen light of the screen and reflected by a glass cover on an outer side of the screen is filtered by the second polarizer, and directing the second optical noise away from the optical fingerprint identification module; and collecting a reflected light of the screen light reflected by a user fingerprint through the optical fingerprint identification module and obtaining a fingerprint image after processing the reflected light, wherein the optical fingerprint identification module comprises a collimating lens, a third polarizer, an infrared IR film, and an optical fingerprint sensor, the third polarizer being arranged between the infrared IR film and the optical fingerprint sensor, the infrared IR film being arranged on surface of the optical fingerprint sensor, and a polarization direction of the third polarizer being the same with the polarization direction of the second polarizer.

15. The electronic device of claim 14, wherein turning on the screen to emit light comprises:

turning on a preset region of the screen to emit light, the preset region being a fingerprint collection region.

16. The electronic device of claim 14, wherein the method further comprises:

comparing the fingerprint image with a preset fingerprint template; and performing an unlocking operation based on the fingerprint image successfully matching the preset fingerprint template.

17. The electronic device of claim 16, wherein the comparing the fingerprint image with the preset fingerprint template comprises:

performing image segmentation on the fingerprint image to obtain a target fingerprint region image;

performing circular image interception on the target fingerprint region image based on M circles having different circular centers to obtain M circular fingerprint region images, where M is an integer greater than 3;

selecting a target circular fingerprint region image from the M circular fingerprint region images, wherein the number of feature points included in the target circular fingerprint region image is greater than the number of feature points included in each of remaining circular fingerprint region images of the M circular fingerprint region images;

dividing the target circular fingerprint region image to obtain a circle and N circular rings, radius of the circle and ring widths of the N circular rings being the same;

starting from a circle with a minimum radius, comparing the feature points contained in the circle and each circular ring with the feature points contained in the preset fingerprint template, and summing up matching values corresponding to compared circle and circular rings to obtain a summed-up matching value; and stopping comparing the feature points based on the summed-up matching value being greater than a target fingerprint recognition threshold and outputting a prompt message indicating that fingerprint recognition is successful.

18. The electronic device of claim 14, wherein the second polarizer and the screen are integrated or stacked.

19. The electronic device of claim 15, wherein at least one of the first optical noise or the second optical noise is light emitted by the preset region.

\* \* \* \* \*